US012601975B2

(12) United States Patent
Zi et al.

(10) Patent No.: US 12,601,975 B2
(45) **Date of Patent: *Apr. 14, 2026**

(54) COMPOSITIONS FOR REDUCING RESIST CONSUMPTION OF EXTREME ULTRAVIOLET METALLIC TYPE RESIST

(71) Applicant: Taiwan Semiconductor Manufacturing Co., Ltd., Hsinchu (TW)

(72) Inventors: An-Ren Zi, Hsinchu (TW); Ming-Hui Weng, Hsinchu (TW); Ching-Yu Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 927 days.

This patent is subject to a terminal disclaimer.

(21) Appl. No.: 17/713,823

(22) Filed: Apr. 5, 2022

(65) Prior Publication Data

US 2022/0404705 A1 Dec. 22, 2022

Related U.S. Application Data

(60) Provisional application No. 63/212,019, filed on Jun. 17, 2021.

(51) Int. Cl.

| | |
|---|---|
| ***G03F 7/36*** | (2006.01) |
| ***G03F 7/11*** | (2006.01) |
| ***H01L 21/027*** | (2006.01) |
| ***H01L 21/033*** | (2006.01) |
| ***H01L 21/311*** | (2006.01) |

(52) U.S. Cl.

CPC .................. *G03F 7/36* (2013.01); *G03F 7/11* (2013.01); *H01L 21/0276* (2013.01); *H01L 21/0337* (2013.01); *H01L 21/31144* (2013.01)

(58) Field of Classification Search

CPC . G03F 7/11; G03F 7/36; C11D 7/5013; C11D 11/0047

See application file for complete search history.

(56) References Cited

U.S. PATENT DOCUMENTS

| | | | | |
|---|---|---|---|---|
| 8,481,247 | B2 * | 7/2013 | Horiguchi | H01L 21/31144 430/326 |
| 9,482,957 | B1 | 11/2016 | Lin | |
| 11,456,170 | B2 * | 9/2022 | Zi | H01L 21/02041 |

(Continued)

FOREIGN PATENT DOCUMENTS

| | | | |
|---|---|---|---|
| CN | 1507582 | A | 6/2004 |
| CN | 102375342 | A | 3/2012 |

(Continued)

*Primary Examiner* — John S. Chu

(74) *Attorney, Agent, or Firm* — Seed IP Law Group

(57) ABSTRACT

A method for reducing resist consumption (RRC) is provided. The method includes treating a surface of a substrate using a RRC composition and forming a photoresist layer comprising a metal-containing material on the RRC composition treated surface. The RRC composition includes a solvent and an acid or a base. The solvent has a dispersion parameter between 10 and 25. The acid has an acid dissociation constant between −20 and 6.8. The base having an acid dissociation constant between 7.2 and 45.

20 Claims, 8 Drawing Sheets

(56) References Cited

U.S. PATENT DOCUMENTS

| | | | | |
|---|---|---|---|---|
| 2005/0176603 | A1* | 8/2005 | Hsu | G03F 7/426 134/42 |
| 2011/0118165 | A1* | 5/2011 | Lee | H01L 21/02074 510/176 |
| 2021/0011383 | A1* | 1/2021 | Cardineau | G03F 7/0043 |

FOREIGN PATENT DOCUMENTS

| | | | |
|---|---|---|---|
| CN | 109075035 | A | 12/2018 |
| TW | 200736855 | A | 10/2007 |
| TW | 200938956 | A | 9/2009 |
| TW | 201807512 | A | 3/2018 |

* cited by examiner

200

202 Provide a substrate having a material layer thereon

204 Apply a composition for reducing resist consumption to a surface of the substrate 206 Form a photoresist layer 208 Expose the photoresist layer to a patterning radiation 210 Form a patterned photoresist layer 212 Etch the material layer

COMPOSITIONS FOR REDUCING RESIST CONSUMPTION OF EXTREME ULTRAVIOLET METALLIC TYPE RESIST

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
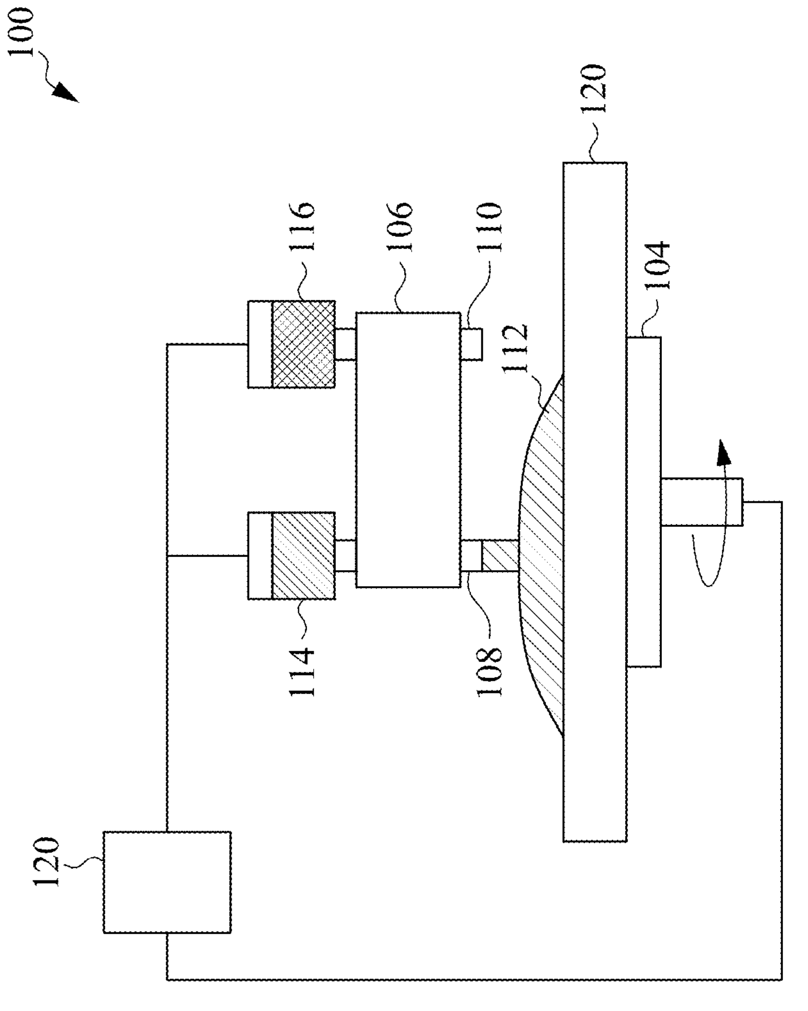
FIG. 1 is a block diagram of a spin coater system for coating a substrate, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The system may be otherwise oriented (rotated 90 degrees or at other orientations) and the spatially relative descriptors used herein may likewise be interpreted accordingly.

IC fabrication uses one or more photolithography processes to transfer geometric patterns to a film or substrate. Geometric shapes and patterns on a semiconductor make up the complex structures that allow the dopants, electrical properties and wires to complete a circuit and fulfill a technological purpose. In a photolithography process, a photoresist is applied as a thin film to a substrate, and subsequently exposed through a photomask. The photomask contains clear and opaque features that define a pattern which is to be created in the photoresist layer. Areas in the photoresist exposed to light transmitted through the photomask are made either soluble or insoluble in a specific type of solution known as a developer. In the case when the exposed regions are soluble, a positive image of the photomask is produced in the photoresist and this type of photoresist is called a positive photoresist. On the other hand, if the unexposed areas are dissolved by the developer, a negative image results in the photoresist and this type of photoresist is called a negative photoresist. After developing, the areas no longer covered by photoresist are removed by etching, thereby replicating the mask pattern in the substrate. To ensure that the projected image is properly exposed onto the substrate, it is important that the photoresist layer is smooth and coats the substrate completely and uniformly. The cost of photoresist is a significant material cost in semiconductor fabrication. Reducing the amount of photoresist used to reduce the fabrication costs is also important.

Spin coating is the most common method used when coating a substrate with photoresist. In order to improve the resist coating thickness uniformity and to reduce the resist dispense volume, prior to applying the photoresist, the surface of the substrate is treated with a solvent, so called reducing resist consumption (RRC) solvent. The RRC solvent provides a clean and hydrophobic surface which boosts the adhesion of the photoresist to the substrate surface. The RRC solvent may typically be OK73, which includes about 70% propylene glycol monomethylether (PGME) and about 30% propylene glycol monomethylether acetate (PGMEA).

As semiconductor device sizes continue to shrink, for example below 20 nanometer nodes, traditional lithography technologies have optical restrictions, which lead to resolution issues and may not achieve the desired lithography performance. In comparison, extreme ultraviolet (EUV) lithography using EUV radiation around 13.5 nm can achieve much smaller device sizes. However, conventional polymer photoresists suffer from low absorption efficiency to EUV light source, long exposure times are thus needed, resulting in low throughput. One solution to this problem is to use metallic photoresists containing metals having high EUV absorbance and improved EUV sensitivity. However, compared to organic photoresists, metallic photoresists tend to be relatively hydrophilic, OK73 thus is no longer suitable as the RRC solvent due to the solubility mismatch between OK73 and the metallic photoresists. Therefore, the resist coating suffers from precipitation of the photoresist material and/or poor resist thickness uniformity, leading to various patterning issues, such as increased line width roughness (LWR) and CD non-uniformity. These patterning defects cause semiconductor fabrication problems and/or degrade semiconductor device performance. Therefore, there is a need for a RRC composition to reduce the resist dispense amount and to improve the coating thickness uniformity of metallic photoresists, which leads to an increase in EUV lithography performance and a decrease in the fabrication cost.

In embodiments of the present disclosure, a composition for reducing resist consumption (RRC) and improving coating thickness uniformity of a metal-containing photoresist (also referred to as RRC composition) is provided. The RRC composition thus helps to improve the EUV lithography performance such as improved line width roughness (LWR) and reduced defect counts. As a result, the final yield is improved and the fabrication cost is reduced.

In some embodiments, the RRC composition includes an organic solvent and an acid or a base.

The organic solvent is selected based on the Hansen solubility parameters, dispersion parameter ($\delta_d$), polarity parameter ($\delta_p$), and hydrogen bonding parameter ($\delta_h$). The polarity parameter ($\delta_p$) is the energy from dipolar intermolecular force between the molecules. The hydrogen bonding parameter ($\delta_h$) is the energy from hydrogen bonds between the molecules. The three parameters, $\delta_d$, $\delta_p$, and $\delta_h$, can be considered as coordinates for a point in three dimensions, known as the Hansen space. The nearer two molecules are in Hansen space, the more likely they are to dissolve into each other. In some embodiments, the organic solvent has a dispersion parameter ($\delta_d$) in between 10 and 25 ($10<\delta_d<25$), a polarity parameter ($\delta_p$) between 3 and 25 ($3<\delta_p<25$), and a hydrogen bonding parameter ($\delta_h$) between 4 and 30 ($4<\delta_h<30$).

The organic solvents having the desired Hansen solubility parameters in the above ranges include, but are not limited to, propylene glycol methyl ether (PGME), propylene glycol ethyl ether (PGEE), γ-butyrolactone (GBL), cyclohexanone (CHN), ethyl lactate (EL), methyl isobutyl carbinol (MIBC), propylene glycol monomethyl ether acetate (PGMEA), methanol, ethanol, propanol, n-butanol, acetone, dimethylfuran, acetonitrile, isopropyl alcohol (IPA), tetrahydrofuran (THF), acetic acid, diacetone alcohol (DAA), and combinations thereof.

In some embodiments, the acid has an acid dissociation constant, pKa, between −20 and 6.8 ($-20<pKa<6.8$). In some embodiments, the acid is an organic acid including, but not limited to, ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, acetic acid, maleic acid, carbonic acid, oxoethanoic acid, 2-hydroxy ethanoic acid, propanedioic acid, butanedioic acid, 3-oxobutanoic acid, hydroxylamine-o-sulfonic acid, formamidine sulfinic acid, methylsulfamic acid, sulfoacetic acid, 1,1,2,2-tetrafluoroethanesulfonic acid, 1,3-propanedisulfonic acid, nonafluorobutane-1-sulfonic acid, 5-sulfosalicylic acid, trichloroacetic acid, and combinations thereof. In some embodiments, the acid is an inorganic acid including, but not limited to, nitric acid ($HNO_3$), sulfuric acid ($H_2SO_4$), hydrochloric acid (HCl), hydrobromic acid (HBr), phosphoric acid ($H_3PO_4$), and combinations thereof.

In some embodiments, the base has a pKa between 7.2 and 45 ($7.2<pKa<45$). In some embodiments, the base is an organic base including, but not limited to, monoethanolamine, monoisopropanolamine, 2-amino-2-methyl-1-propanol, 1H-benzotriazole, 1,2,4-triazole, 1,8-diazabicycloundec-7-ene, 1,5-Diazabicyclo[4.3.0]non-5-ene, tetrabutylammonium hydroxide, tetramethylammonium hydroxide (TMAH), tetraethylammonium hydroxide (TEAH), tetrapropylammonium hydroxide, and combinations thereof. In some embodiments, the base is an inorganic base including, but not limited to, ammonia ($NH_3$), ammonium hydroxide, ammonium sulfamate, ammonium carbamate, sodium hydroxide (NaOH), potassium hydroxide (KOH), and combinations thereof.

In some embodiments, the concentration of the acid or base ranges from 0.001 wt. % to 30 wt. % based on the total weight of the RRC composition. In some embodiments, the concentration of the acid or base ranges from 0.1 wt. % to 20 wt. % based on the total weight of the RRC composition In some embodiments, the RRC composition further includes a chelating agent. In some embodiments, the chelating agent includes, but is not limited to, ethylenediaminetetraacetic acid (EDTA), ethylenediamine-N,N'-disuccinic acid (EDDS), diethylenetriaminepentaacetic acid (DTPA), polyaspartic acid, trans-1,2-cyclohexanediamine-N,N,N',N'-tetraacetic acid monohydrate, ethylenediamine, and combinations thereof. The RRC composition may include 30 wt. % or less of chelating agent. In some embodiments, the concentration of the chelating agent ranges from 0.001 wt. % to 30 wt. % based on the total weight of the RRC composition. In some embodiments, the concentration of the chelating agent ranges from 0.01 wt. % to 20 wt. % based on the total weight of the RRC composition.

In some embodiments, the RRC composition further includes a surfactant to increase the solubility and reduce the surface tension of the substrate. In some embodiments, the surfactant includes, but not limited to, alkylbenzenesulfonates, lignin sulfonates, fatty alcohol ethoxylates, and alkylphenol ethoxylates. In some embodiments, the surfactant is selected from the group consisting of sodium stearate, 4-(5-dodecyl) benzenesulfonate, ammonium lauryl sulfate, sodium lauryl sulfate, sodium laureth sulfate, sodium myreth sulfate, dioctyl sodium sulfosuccinate, perfluorooctanesulfonate, perfluorobutanesulfonate, alkyl-aryl ether phosphate, alkyl ether phosphates, sodium lauroyl sarcosinate, perfluorononanoate, perfluorooctanoate, octenidine dihydrochloride, cetrimonium bromide, cetylpyridinium chloride, benzalkonium chloride, benzethonium chloride, methyldioctadecylammonium chloride, dioctadecyldimethylammonium bromide, 3-[(3-cholamidopropyl) dimethylammonio]-1-propanesulfonate, cocamidopropyl hydroxysultaine, cocamidopropyl betaine, phospholipidsphosphatidylserine, phosphatidylethanolamine, phosphatidylcholine, sphingomyelins, octaethylene glycol monodecyl ether, pentaethylene glycol monodecyl ether, polyethoxylated tallow amine, cocamide monoethanolamine, cocamide diethanolamine, glycerol monostearate, glycerol monolaurate, sorbitan monolaurate, sorbitan monostearate, sorbitan tristearate, and combinations thereof. In some embodiments, the surfactant is polyethylene oxide or polypropylene oxide.

The RRC composition may include 5 wt. % or less of surfactant. In some embodiments, the concentration of the surfactant ranges from 0.1 wt. % to 5 wt. % based on the total weight of the RRC composition.

In some embodiments, the RRC composition further includes an aqueous solvent. As used herein, the term "aqueous solvent" denotes a liquid that is water miscible (miscibility in water of greater than 50% by weight at 25° C. and atmospheric pressure). In some embodiments, the aqueous solvent includes lower monoalcohols containing from 1 to 5 carbon atoms, such as ethanol and isopropanol, glycols containing from 2 to 8 carbon atoms, such as ethylene glycol, propylene glycol, 1,3-butylene glycol and dipropylene glycol, C3-C4 ketones and C2-C4 aldehydes. The RRC composition may include 20 wt. % or less of aqueous solvent. In some embodiments, the concentration of the aqueous solvent ranges from 0.001 wt. % to 20 wt. % based on the total weight of the RRC composition. In some embodiments, the concentration of the aqueous solvent ranges from 0.1 wt. % to 10 wt. % based on the total weight of the RRC composition.

In some embodiments, the RRC composition further includes water. The RRC composition may include 20 wt. % or less of water. In some embodiments, the concentration of water ranges from 0.1 wt. % to 20 wt. % based on the total weight of the RRC composition. In some embodiments, the concentration of water ranges from 10 wt. % to 20 wt. % based on the total weight of the RRC composition.

In some embodiments, the RRC composition further includes a high boiling point solvent with a boiling point greater than 150° C. In some embodiments, the high boiling point solvent that can be employed in the present disclosure includes, but is not limited to, cyclohexyl acetate (CHAX), dipropylene glycol dimethyl ether (DPDME), propylene glycol diacetate (PGDA), dipropylene glycol methyl n-propyl ether (DPMNP), dipropylene glycol methyl ether acetate (DPMA), 1,4-butanediol diacrylate (1,4-BDDA), 1,3-butanediol diacetate (1,3-BGDA), 1,6-hexanediol diacrylate (1,6-HDDA), tripropylene glycol monomethyl ether (TPM), 1,3-propanediol, propylene glycol, 1-methoxy-2-(2-propoxypropoxy)propane, hexane-1,6-diyl diacetate, butane-1,4-diyl diacetate, propane-1,2-diyl diacetate, 2-methoxy-1-((1-methoxypropan-2-yl)oxy)propane, 1-((1-methoxypropan-2-yl)oxy)propan-2-yl acetate, butane-1,2,4-triol, 2-(2-(2-methoxypropoxy)propoxy)propan-1-ol, and combinations thereof. The RRC composition may include 35 wt. % or less of high boiling point solvent. In some embodiments, the concentration of the high boiling point solvent ranges from 0.1 wt. % to 35 wt. % based on the total weight of the RRC composition.

FIG. 1 is a block diagram of a spin coater system 100 for coating a substrate 102 with a thin film, in accordance with some embodiments of the present disclosure. It is noted that the system 100 is merely an example, and is not intended to limit the present disclosure. Accordingly, it is understood that additional functional blocks may be provided in or coupled to the system 100 of FIG. 1, and that some other functional blocks may only be briefly described herein.

In the illustrated embodiment, the spin coater system 100 is to deposit a uniform thin film to a surface of a substrate 102 using centrifugal force. In some embodiments, the thin film comprises a RRC composition or a photoresist. In some embodiments, the system 100 comprises a chuck 104 for securing the substrate 102 firmly without deflection while operating at a very high rotational speed. In some embodiments, the chuck 104 has a mass that allows for instantaneous direction and speed change with precise acceleration and deceleration control. In some embodiments, the chuck 104 is a vacuum chuck. In some embodiments, the vacuum chuck 104 comprises a low-profile, O-ring seal for high-performance vacuum seal. In some other embodiments, the chuck 104 comprises an edge-grip chuck for substrates that are sensitive to vacuum contact. In some embodiments, the chuck 104 is attached to a motor (not shown) which is configured to provide precise speed control.

In some embodiments, the system 100 comprises a holder 106 with at least one nozzle 108/110 for dispensing a coating 112 onto the substrate 102. In the illustrated embodiment, the system 100 comprises two nozzles 108 and 110 with a first nozzle 108 for dispensing a RRC composition of the present disclosure from a RRC composition source 114 and a second nozzle 110 for dispensing a photoresist from a photoresist source 116. In some embodiments, the RRC composition source 114 and the photoresist source 116 each comprise a respective pump (not shown) for injecting the materials into the respective nozzles 108/110. In some embodiments, the RRC composition and photoresist are both directed through a single nozzle and injected by a single pump.

In some embodiments, the pump attached to the RRC composition source 114 and photoresist source 116 is further coupled to a controller 120 to control the time and rate of the dispensing of the RRC composition and the photoresist. In some embodiments, the controller 120 is further coupled to the motor coupled to the chuck 104 so as to control the speed, acceleration/deceleration, and spinning time of the chuck 104. In some embodiments, the dispensing of the RRC composition and the photoresist and the spinning of the chuck are synchronized and automatically controlled by the controller 120.

In some embodiments, the controller 120 is a representative device and may comprise a processor, a memory, an input/output interface, a communications interface, and a system bus. The processor may comprise any processing circuitry operative to control the operations and performance of the controller 120. In various aspects, the processor may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor also may be implemented by a controller, a microcontroller, an application specific integrated circuit (ASIC), a field programmable gate array (FPGA), a programmable logic device (PLD), and so forth.

In various aspects, the processor may be arranged to run an operating system (OS) and various applications. Examples of an OS comprise, for example, operating systems generally known under the trade name of Apple OS, Microsoft Windows OS, Android OS, and any other proprietary or open source OS.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory.

In some embodiments, the memory may comprise any machine-readable or computer-readable media capable of storing data, including both volatile/non-volatile memory and removable/non-removable memory. The memory may comprise at least one non-volatile memory unit. The non-volatile memory unit is capable of storing one or more software programs. The software programs may contain, for example, applications, user data, device data, and/or configuration data, or combinations thereof, to name only a few. The software programs may contain instructions executable by the various components of the controller 120 of the system 100.

For example, memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EE- PROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory may contain an instruction set, in the form of a file for executing a method of generating one or more timing libraries as described herein. The instruction set may be stored in any acceptable form of machine-readable instructions, including source code or various appropriate programming languages. Some examples of programming languages that may be used to store the instruction set comprise, but are not limited to: Java, C, C++, C#, Python, Objective-C, Visual Basic, or .NET programming. In some embodiments a compiler or interpreter is comprised to convert the instruction set into machine executable code for execution by the processor.

In some embodiments, the I/O interface may comprise any suitable mechanism or component to at least enable a user to provide input (i.e., configuration parameters, etc.) to the controller 120 and the controller 120 to provide output control to the other components of the system 100 (e.g., pump, motor, etc.).

Figure 2:
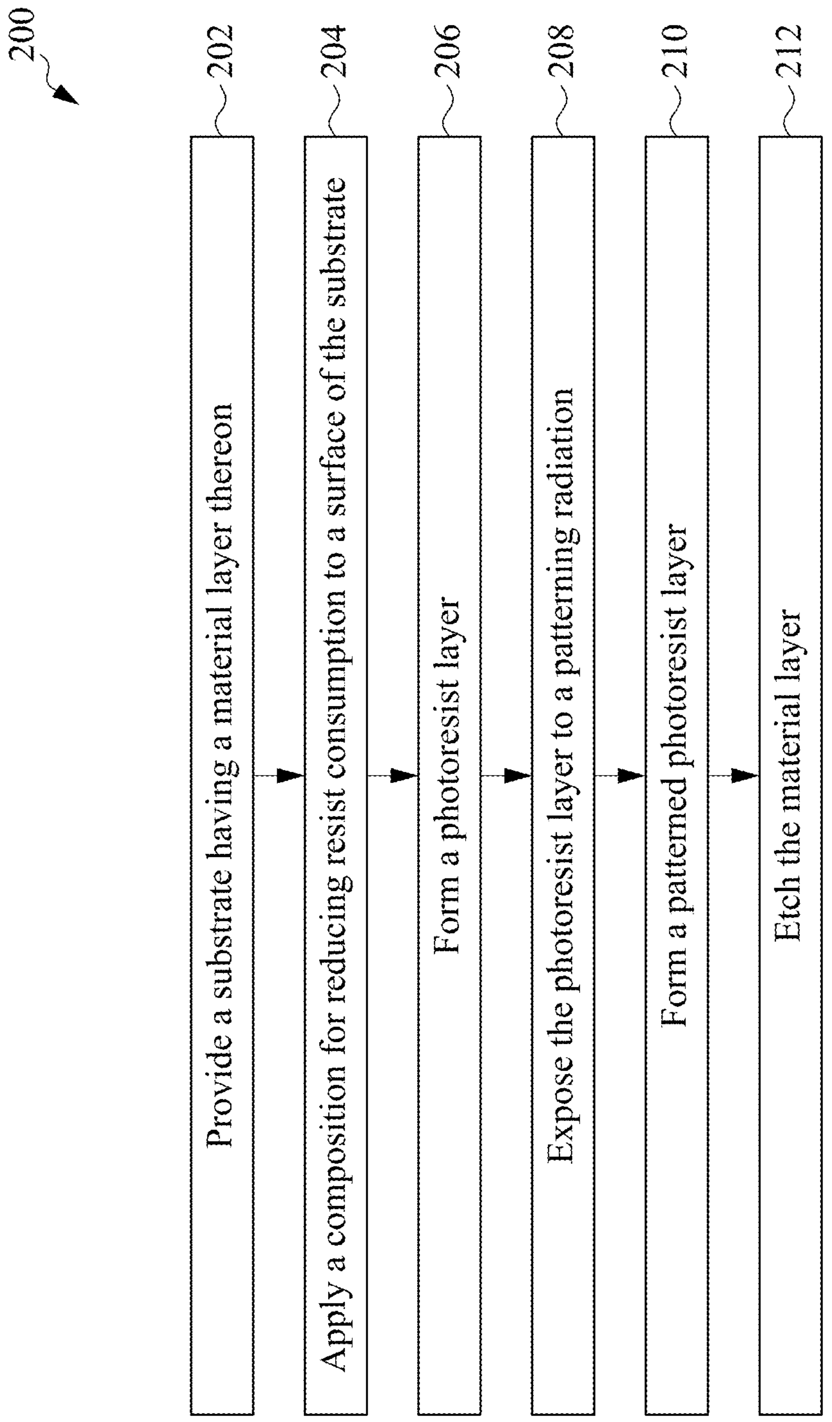
FIG. 2 is a flow chart of a method for fabricating a semiconductor structure, in accordance with some embodiments.

FIG. 2 is a flowchart illustrating a method 200 of fabricating a semiconductor structure, in accordance with some embodiments of the present disclosure. FIG. 3A through 3F are cross-sectional views of a semiconductor structure 300 at various fabrication stages, constructed in accordance with some embodiments. The method 200 is described below in conjunction with FIG. 2 and FIGS. 3A through 3F wherein the semiconductor structure 300 is fabricated by using embodiments of the method 200. It is understood that additional steps can be provided before, during, and after the method 200, and some of the steps described below can be replaced or eliminated, for additional embodiments of the method. It is further understood that additional features can be added in the semiconductor structure 300, and some of the features described below can be replaced or eliminated, for additional embodiments of the semiconductor structure 300.

The semiconductor structure 300 may be an intermediate structure during the fabrication of an IC, or a portion thereof. The IC may include logic circuits, memory structures, passive components (such as resistors, capacitors, and inductors), and active components such as diodes, field-effect transistors (FETs), metal-oxide semiconductor field effect transistors (MOSFETs), complementary metal-oxide semiconductor (CMOS) transistors, bipolar transistors, high voltage transistors, high frequency transistors, fin-like FETs (FinFETs), other three-dimensional (3D) FETs, and combinations thereof. The semiconductor structure 300 may include a plurality of semiconductor devices (e.g., transistors), which may be interconnected.

Figure 3A:
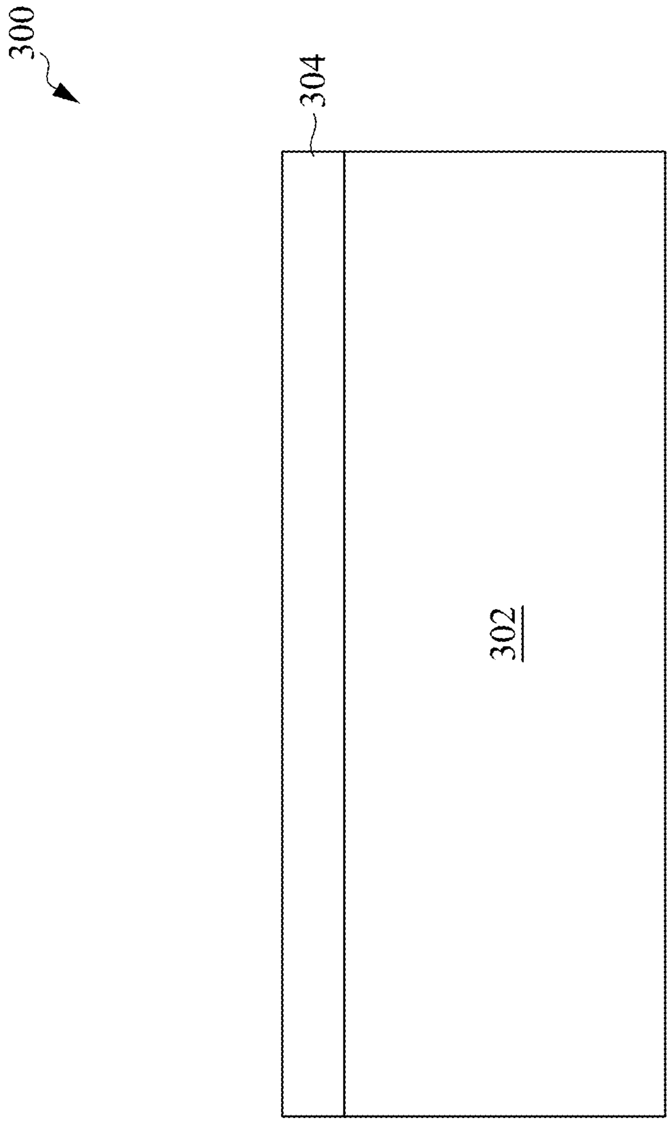
FIGS. 3A-3F are cross-sectional views of a semiconductor structure fabricated using the method of FIG. 2, in accordance with some embodiments.

Referring to FIGS. 2 and 3A, the method 200 includes operation 202, in which a substrate 302 is provided in a semiconductor machine, in accordance with some embodiments. The semiconductor machine is, for example, a spin coater system 100 of FIG. 1. FIG. 1A is a cross-sectional view of a semiconductor structure 300 including the substrate 302, in accordance with some embodiments.

In some embodiments, the substrate 302 may be a bulk semiconductor substrate including one or more semiconductor materials. In some embodiments, the substrate 302 may include silicon, silicon germanium, carbon doped silicon (Si:C), silicon germanium carbide, or other suitable semiconductor materials. In some embodiments, the substrate 302 is composed entirely of silicon.

In some embodiments, the substrate 302 may include one or more epitaxial layers formed on a top surface of a bulk semiconductor substrate. In some embodiments, the one or more epitaxial layers introduce strains in the substrate 302 for performance enhancement. For example, the epitaxial layer includes a semiconductor material different from that of the bulk semiconductor substrate, such as a layer of silicon germanium overlying bulk silicon or a layer of silicon overlying bulk silicon germanium. In some embodiments, the epitaxial layer(s) incorporated in the substrate 302 are formed by selective epitaxial growth, such as, for example, metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), or combinations thereof.

In some embodiments, the substrate 302 may be a semiconductor-on-insulator (SOI) substrate. In some embodiments, the SOI substrate includes a semiconductor layer, such as a silicon layer formed on an insulator layer. In some embodiments, the insulator layer is a buried oxide (BOX) layer including silicon oxide or silicon germanium oxide. The insulator layer is provided on a handle substrate such as, for example, a silicon substrate. In some embodiments, the SOI substrate is formed using separation by implanted oxygen (SIMOX) or other suitable techniques, such as wafer bonding and grinding.

In some embodiments, the substrate 302 may also include a dielectric substrate such as silicon oxide, silicon nitride, silicon oxynitride, a low-k dielectric, silicon carbide, and/or other suitable layers.

In some embodiments, the substrate 302 may also include various p-type doped regions and/or n-type doped regions, implemented by a process such as ion implantation and/or diffusion. Those doped regions include n-well, p-well, lightly doped region (LDD) and various channel doping profiles configured to form various IC devices, such as a COMOS transistor, imaging sensor, and/or light emitting diode (LED). The substrate 302 may further include other functional features such as a resistor and/or a capacitor formed in and/or on the substrate 302.

In some embodiments, the substrate 302 may also include various isolation features. The isolation features separate various device regions in the substrate 302. The isolation features include different structures formed by using different processing technologies. For example, the isolation features may include shallow trench isolation (STI) features. The formation of an STI may include etching a trench in the substrate 302 and filling in the trench with insulator materials such as silicon oxide, silicon nitride, and/or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

In some embodiments, the substrate 302 may also include gate stacks formed by dielectric layers and electrode layers. The dielectric layers may include an interfacial layer and a high-k dielectric layer deposited by suitable techniques, such as chemical vapor deposition (CVD), atomic layer deposition (ALD), physical vapor deposition (PVD), thermal oxidation, combinations thereof, and/or other suitable techniques. The interfacial layer may include silicon dioxide and the high-k dielectric layer may include LaO, AlO, ZrO, TiO, $Ta_2O_5$, $Y_2O_3$, $SrTiO_3$, $BaTiO_3$, BaZrO, HfZrO, HfLaO, HfSiO, LaSiO, AlSiO, HfTaO, HfTiO, $(Ba,Sr)TiO_3$ (BST), $Al_2O_3$, $Si_3N_4$, SiON, and/or other suitable materials. The electrode layer may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The electrode layer may include Ti, Ag, Al, TiAlN, TaC, TaCN, TaSiN, Mn, Zr, TiN, TaN, Ru, Mo, Al, WN, Cu, W, any suitable materials, and/or a combination thereof.

In some embodiments, the substrate 302 may also include a plurality of inter-level dielectric (ILD) layers and conductive features integrated to form an interconnect structure configured to couple the various p-type and n-type doped regions and the other functional features (such as gate electrodes), resulting in a functional integrated circuit. In one example, the substrate 302 may include a portion of the interconnect structure and the interconnect structure may include a multi-layer interconnect (MLI) structure and an ILD layer integrated with a MLI structure, providing an electrical routing to couple various devices in the substrate 302 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

In some embodiments, the substrate 302 may include a material layer 304 that can be patterned by the method 200 and as such may also be referred to as a patternable layer. In some embodiments, the material layer 304 serves as a hard mask layer including material(s) such as silicon oxide, silicon nitride, silicon oxynitride, or titanium nitride. In some embodiments, the material layer 304 serves as an anti-reflection coating layer including nitrogen-free material (s) such as silicon oxide, silicon oxygen carbide, or plasma enhanced chemical vapor deposited silicon oxide. In some embodiments, the material layer 304 is formed by a deposition process such as, for example, chemical vapor deposition (CVD), physical vapor deposition (PVD), or plasma enhanced chemical vapor deposition (PECVD). The material layer 304 is optional and is omitted in some embodiments.

Figure 3B:
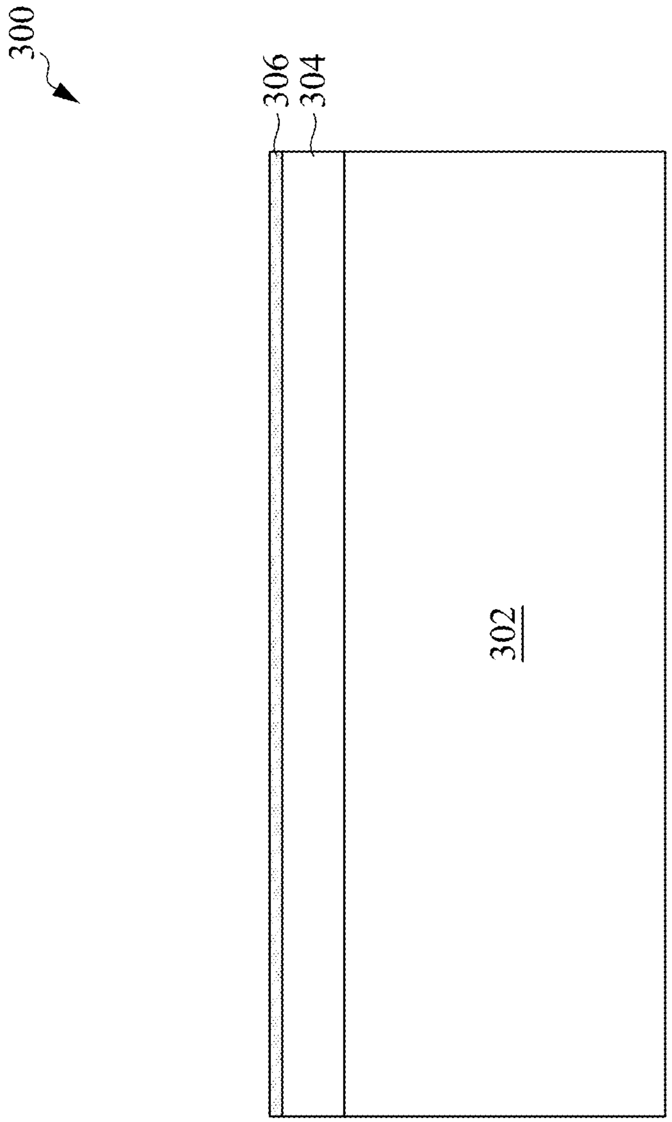

Referring to FIGS. 2 and 3B, the method 200 proceeds to operation 204, in which a RRC composition is applied to the surface of the substrate 302 (e.g., the surface of the material layer 304) to form a RRC layer 306, in accordance with some embodiments. FIG. 3B is a cross-sectional view of the structure 300 after applying the RRC composition to the surface of the substrate 302 to form the RRC layer 306, in accordance with some embodiments.

As discussed above, the RRC composition includes an organic solvent having Hansen solubility parameters in specific ranges and an acid or a base. The RRC composition is configured to moisten a surface of the substrate 302 for diminishing the surface tension between the photoresist and the surface of the substrate 302. As a result, the photoresist consumption is reduced and the thickness uniformity of the photoresist coating is enhanced. Various additives such as chelating agent, surfactant, aqueous solvent, high boiling point solvent, and/or water are added as discussed above to further improve the efficacy of RRC composition in reducing the photoresist consumption and improving the thickness uniformity of the photoresist coating.

In some embodiments, the RRC composition is dispersed through a nozzle (e.g., nozzle 108 of FIG. 1) to the surface of the substrate 302 at a suitable flow rate and at a predetermined amount. In some embodiments, the RRC composition is dispersed at a flow rate between 5 standard cubic centimeters per minute (secm) and about 30 secm. In some embodiments, the RRC composition is dispersed while the substrate 302 is spinning. In some embodiments, the spinning speed is in the range from 1500 revolutions per minute (rpm) to 3500 rpm so that the RRC layer 306 can be spread out evenly over the surface of the substrate to provide the RRC layer 306 with a uniform thickness. In some embodiments, the RRC composition is dispensed while the substrate 302 is in the static state (i.e., not spinning). After dispensing the RRC composition, the substrate 302 is spanned so that the RRC composition can be spread out evenly over the entire surface of the substrate 302 to obtain the RRC layer 306 with a uniform thickness. In some embodiments, the substrate 302 can be spun at a spin speed ranging from 50 revolutions per minute (rpm) to 1500 rpm for a period of 1 second to 20 seconds.

Figure 3C:
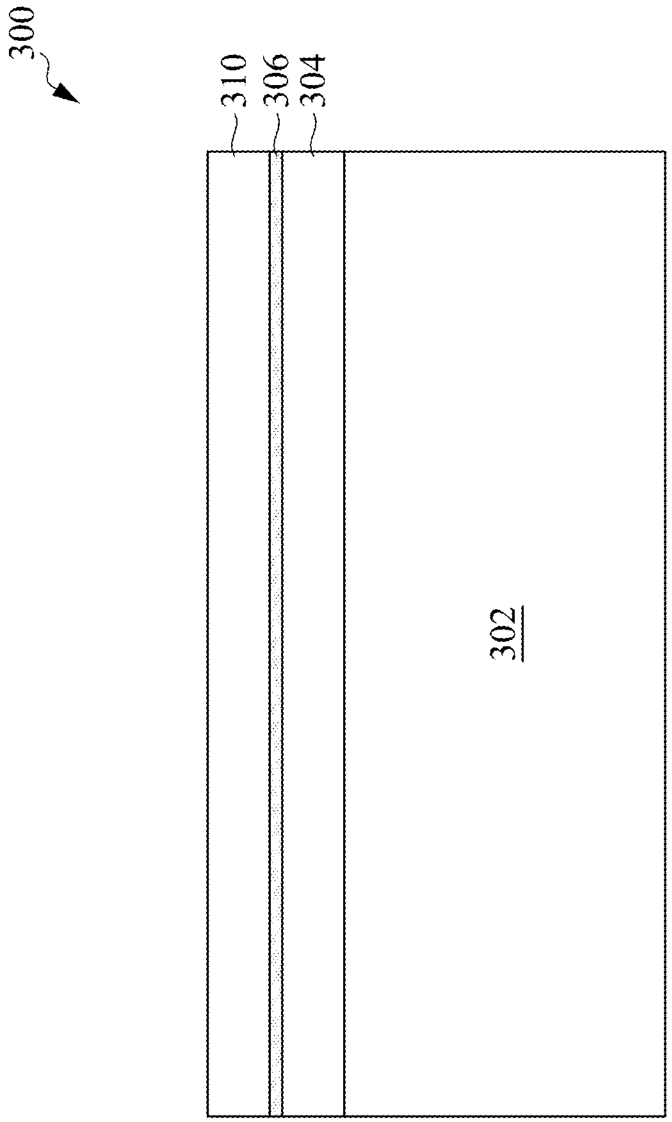

Referring to FIGS. 2 and 3C, the method 200 proceeds to operation 206, in which a photoresist layer 310 is formed over the RRC layer 306, in accordance with some embodiments. FIG. 3C is a cross-sectional view of the structure 300 after forming the photoresist layer 310 over the RRC layer 306, in accordance with some embodiments.

The photoresist layer 310 is sensitive to radiation used in a lithography exposure process and has a resistance to etch (or implantation). In some embodiments, the photoresist layer 310 is sensitive to a radiation, such as I-line light, a DUV light (e.g., 248 nm radiation by krypton fluoride (KrF) excimer laser or 193 nm radiation by argon fluoride (ArF) excimer laser, an EUV light (e.g., 13.5 nm light), an electron beam (e-beam), and an ion beam. In the present embodiment, the photoresist layer 310 is sensitive to EUV radiation.

As discussed above, photon absorption has been a problem in EUV lithography if conventional organic photoresist is used. Therefore, metal-containing photoresists are used in the present disclosure. In some embodiments, the photoresist layer 310 includes a metal-containing material, a polymeric material as a matrix that is resistive to etch (or implantation), radiation-sensitive component (such as photo-acid generator (PAG)) that is reactive to the polymeric material, a quencher base, and a chromophore.

In some embodiments, the metal-containing material of the photoresist layer 310 includes one or more metallic elements, such as cesium (Cs), barium (Ba), lanthanum (La), indium (In), cerium (Ce), silver (Ag), or tin (Sn), or combinations thereof.

In some embodiments, the metal-containing material includes metal oxide nanoparticles. In some embodiments, the photoresist layer 310 includes one or more metal oxides nanoparticles selected from the group consisting of titanium dioxide, zinc oxide, zirconium dioxide, nickel oxide, cobalt oxide, manganese oxide, copper oxides, iron oxides, strontium titanate, tungsten oxides, vanadium oxides, chromium oxides, tin oxides, hafnium oxide, indium oxide, cadmium oxide, molybdenum oxide, tantalum oxides, niobium oxide, aluminum oxide, and combinations thereof. As used herein, nanoparticles are particles having an average particle size between about 1 nm and about 20 nm. Metal oxide nanoparticle sizes less than about 1 nm are difficult to obtain and use in photoresist compositions. Metal oxide nanoparticles greater than about 20 nm are too large for use in a resist in embodiments of the disclosure. In some embodiments, the metal oxide nanoparticles have an average particle size between about 2 and about 5 nm. In some embodiments, the amount of metal oxide nanoparticles in the photoresist composition ranges from about 1 wt. % to about 15 wt. % based on the weight of the solvent for the photoresist composition. In some embodiments, the amount of nanoparticles in the photoresist composition ranges from about 2 wt. % to about 10 wt. % based on the weight of the solvent for the photoresist composition. Concentrations of the metal oxide nanoparticles less than about 1 wt. % provide a photoresist coating that is too thin. Concentrations of the metal oxide nanoparticles greater than about 15 wt. % will provide a photoresist composition that is too viscous and that will be difficult to provide a photoresist coating of uniform thickness on the substrate 302.

In some embodiments, the metal oxide nanoparticles are complexed with a ligand. In some embodiments, the ligand is a carboxylic acid or sulfonic acid ligand. For example, in some embodiments, zirconium oxide or hafnium oxide nanoparticles are complexed with methacrylic acid forming zirconium methacrylic acid (ZrMAA) or hafnium methacrylic acid (HfMAA). In some embodiments, the metal oxide nanoparticles are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen. In some embodiments, the ligand concentration is about 10 wt. % to about 40 wt. % based on the weight of the metal oxide nanoparticles. At concentrations of the ligand below about 10 wt. %, the concentration of the ligand is insufficient to complex the metal oxide nanoparticles. Concentrations of the ligand above about 40 wt. % do not provide a significant improvement in complexing the metal oxide nanoparticles over concentrations of the ligand at about 40 wt. %.

In some embodiments, the metal oxide/ligand complexes are formed of a cluster including metallic core having a metal with high EUV absorption, such as Cs, Ba, La, Ce, In, Sn, Ag, or Sb combined with oxygen and/or nitrogen to form 1 to 12 metal core-clusters. The metallic core-clusters are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen in some embodiments.

Examples of suitable metal oxide/ligand complexes according to embodiments of the disclosure are:

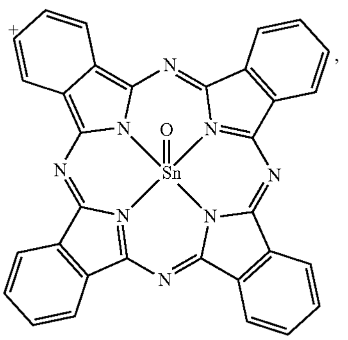

-continued

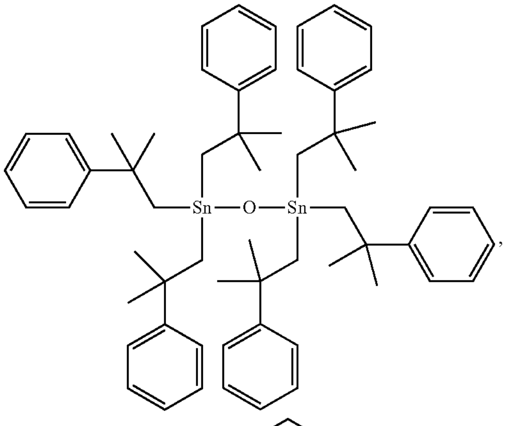

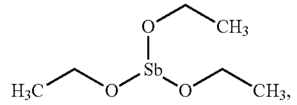

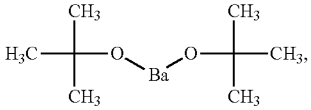

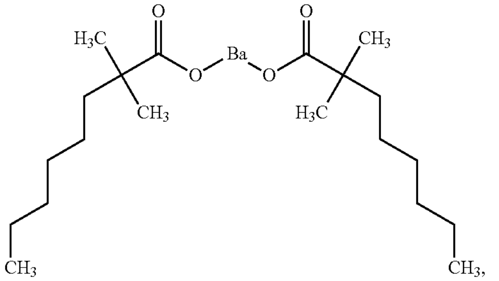

or

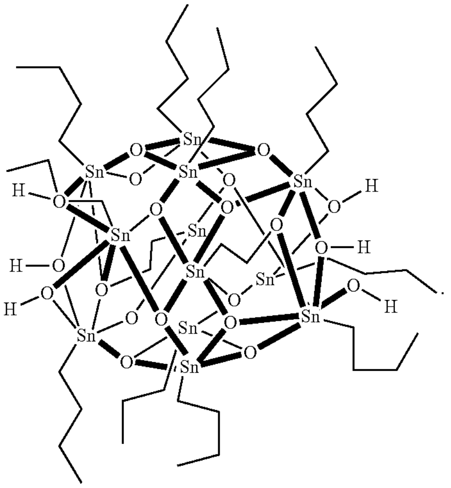

The photoresist layer 310 is formed by a spin coating process in some embodiments. In some embodiments, the photoresist layer 310 is further treated with a soft baking process to drive off the solvent. In some embodiments, the soft bake process is performed at a temperature suitable to evaporate the solvent in the photoresist layer 310, such as between about 100° C. and 200° C., although the precise temperature depends upon the materials chosen for the photoresist layer 310. For example, in some embodiments, the photoresist layer 310 is heated to about 150° C. The soft bake process is performed for a time sufficient to cure and dry the photoresist layer 310. In some embodiments, the soft bake process is performed for a time period from about 10 seconds to about 10 minutes. For example, in some embodiments, the photoresist layer 310 is cured for about 300 seconds.

Figure 3D:
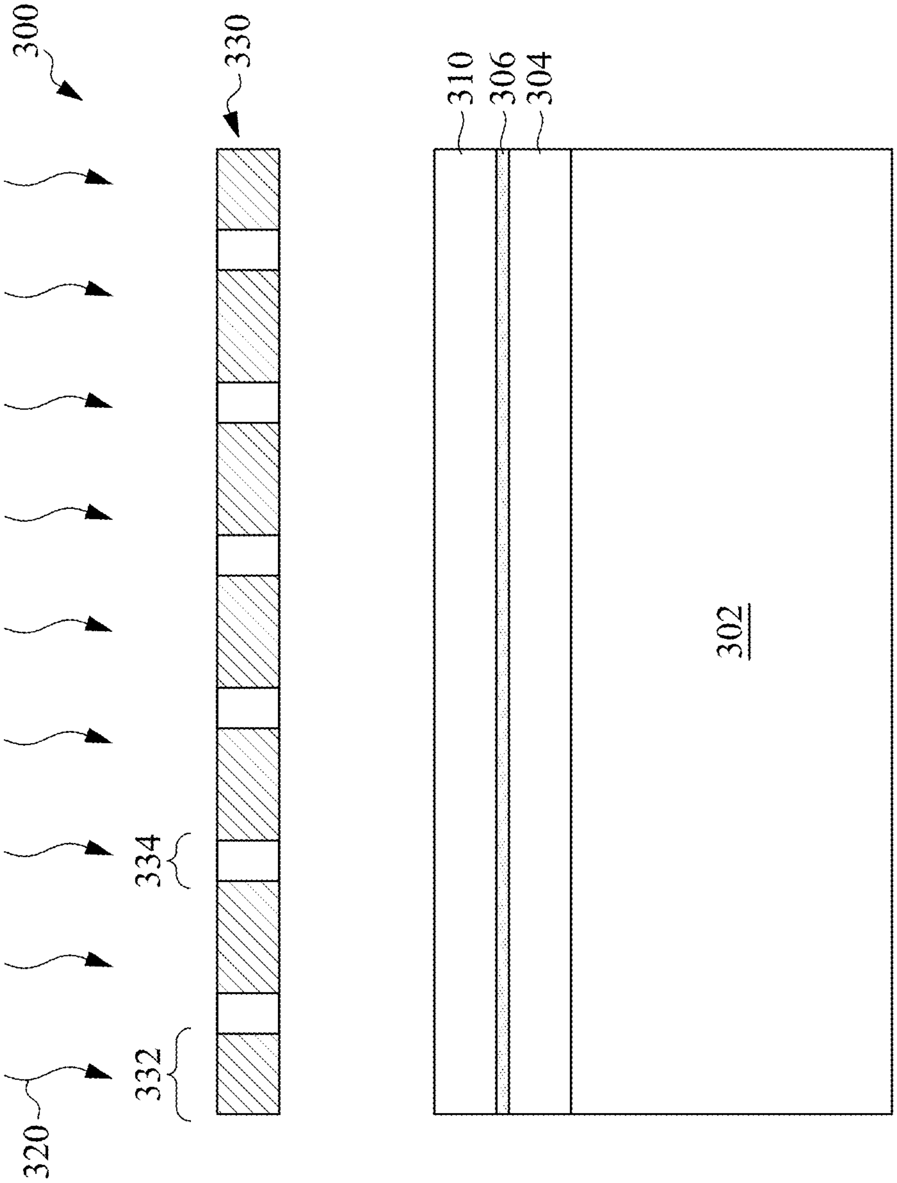

Referring to FIGS. 2 and 3D, the method 200 proceeds to operation 208, in which the photoresist layer 310 is exposed to a patterning radiation 320, in accordance with some embodiments. FIG. 3D is a cross-sectional view of the structure 300 after exposing the photoresist layer 310 to the patterning radiation 320, in accordance with some embodiments.

In some embodiments, the photoresist layer 310 is exposed to the patterning radiation 320 from a light source through a photomask 330. The photomask 330 has a predefined pattern designed for an IC, based on a specification of the IC to be manufactured. The patterns of the photomask 330 correspond to patterns of materials that make up the various components of the IC device to be fabricated. For example, a portion of the IC design layout includes various IC features, such as an active region, gate electrode, source and drain, metal lines or vias of an interlayer interconnection, and openings for bonding pads, to be formed in the substrate 302 and/or the material layer 304 disposed on the substrate 302.

The photomask 330 includes first regions 332 and second regions 334. In the first regions 332, the patterning radiation 320 is blocked by the photomask 330 to reach the photoresist layer 310, while in the second regions 334, the patterning radiation 320 is not blocked by the photomask 330 and can pass through the photomask 330 to reach the photoresist layer 310. As a result, portions of the photoresist layer 310 below the second regions 334 receive the patterning radiation 320, referred to as exposed portions. While portions of the photoresist layer 310 below the first regions 332 do not receive the patterning radiation 320, referred to as unexposed portions.

In some embodiments, the patterning radiation 320 is an EUV radiation (e.g., 13.5 nm). Alternatively, in some embodiments, the patterning radiation 320 is a DUV radiation (e.g., from a 248 nm KrF excimer laser or a 193 nm ArF excimer laser), X-ray radiation, an e-beam radiation, an ion beam radiation, or other suitable radiations. In some embodiments, operation 208 is performed in a liquid (immersion lithography) or in a vacuum for EUV lithography and e-beam lithography.

Subsequently, the photoresist layer 310 may be subjected to a post-exposure bake process. The post-exposure bake process may be performed at a temperature from about 50° C. to about 150° C. for a duration from about 60 seconds to about 360 seconds.

Figure 3E:
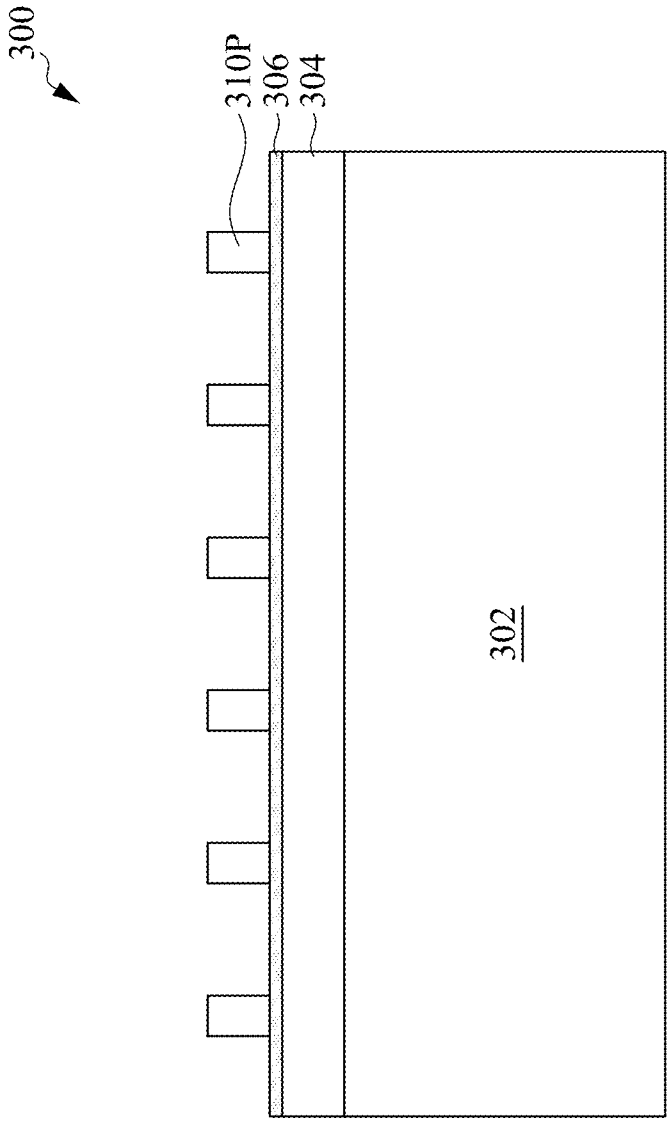

Referring to FIGS. 2 and 3E, the method 200 proceeds to operation 210, in which the photoresist layer 310 is developed using a developer to form a patterned photoresist layer 310P, in accordance with some embodiments. FIG. 3E is a cross-sectional view of the structure 300 after forming the patterned photoresist layer 310P, in accordance with some embodiments.

Referring to FIG. 3E, during the developing process, the developer is applied to the photoresist layer 310. The developer may remove the exposed or unexposed portions of the photoresist layer 310 depending on the resist type. For example, and as shown in FIG. 3E, the photoresist layer 310 includes a negative tone resist, so the portions of the photoresist layer 310 that are exposed by the patterning radiation 320 are not dissolved by the developer and remain in the structure 300. On the other hand, if the photoresist layer 310 includes a positive tone resist, the portions of the photoresist layer 310 that are exposed by the patterning radiation 320 would be dissolved by the developer, leaving the unexposed portions in the structure 300.

The developer may include alcohols, aromatic hydrocarbons, and the like. Examples of alcohols include, but are not limited to, methanol, ethanol, 1-butanol, and 4-methyl-2-pentanol. Examples of aromatic hydrocarbons include, but are not limited to, xylene, toluene and benzene. In some embodiments, the developer is selected from at least one of methanol, 4-methyl-2-pentanol and xylene.

The developer may be applied using any suitable methods. In some embodiments, the developer is applied by dipping the structure into a developer bath. In some embodiments, the developing solution is sprayed onto the photoresist layer 310.

In the present disclosure, by using the RRC composition to treat the surface of the substrate 302 so to improve the thickness uniformity of the photoresist layer 310, the performance of the metal-containing photoresist is greatly enhanced with the LWR being improved greater than about 3%, the expose energy being reduced greater than about 3%, and defect counts being reduced greater than 5%. Consequently, the photoresist pattern can be transferred to the underlying layer at a high precision.

Figure 3F:
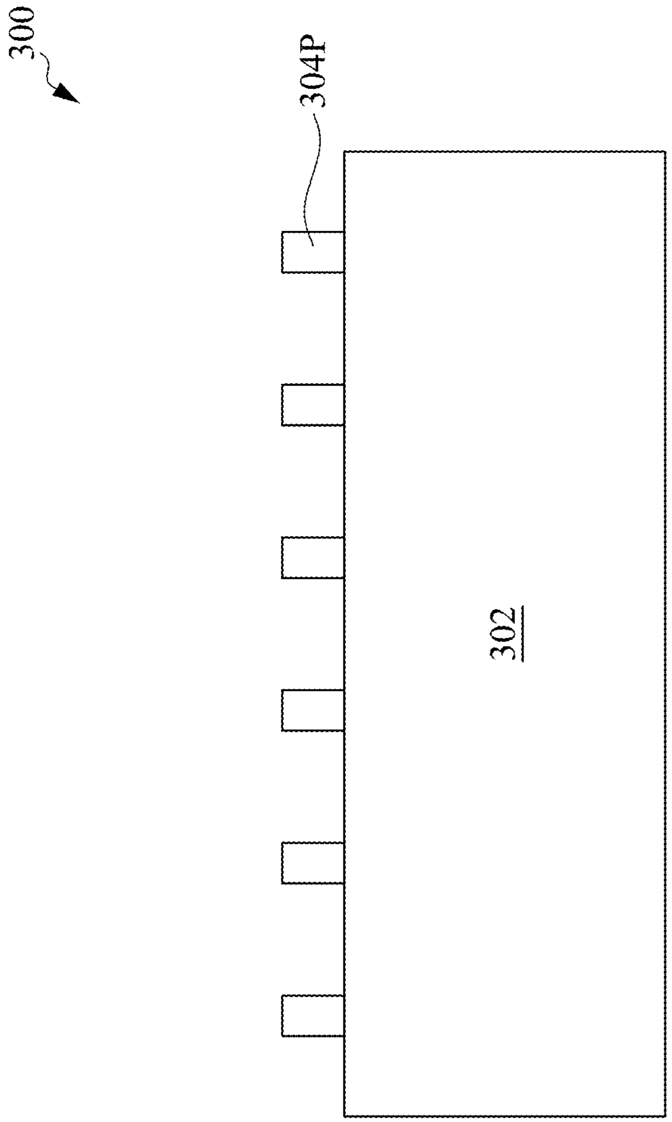

Referring to FIGS. 2 and 3F, the method 200 proceeds to operation 212, in which the material layer 304 is etched using the patterned photoresist layer 310P as an etch mask, in accordance with some embodiments. FIG. 3F is a cross-sectional view of the structure 300 after etching the material layer 304 using the patterned photoresist layer 310P as an etch mask, in accordance with some embodiments.

Referring to FIG. 3F, the material layer 304 is patterned, using the patterned photoresist layer 310P as an etch mask, to form a patterned material layer 304P.

An etching process may be performed to transfer the pattern in the patterned photoresist layer 310P to the material layer 304. In some embodiments, the etching process employed is an anisotropic etch such as a dry etch although any suitable etch process may be utilized. In some embodiments, the dry etch is a reactive ion etch (RIE) or a plasma etch. In some embodiments, the dry etch is implemented by fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. In some embodiments, an oxygen plasma is performed to etch the material layer 304. In some embodiments, the anisotropic etch is performed at a temperature from about 250° C. to 450° C. for a duration from about 20 seconds to about 300 seconds.

If not completely consumed in the etching process, after formation of the patterned material layer 304P, the patterned photoresist layer 310P is removed, for example, by plasma ashing or wet stripping.

One aspect of this description relates to a method for reducing resist consumption (RRC). The method includes treating a surface of a substrate using a RRC composition and forming a photoresist layer comprising a metal-containing material on the RRC composition treated surface. The RRC composition includes a first solvent and an acid or a base. The first solvent has a dispersion parameter between 10 and 25. The acid has an acid dissociation constant between −20 and 6.8. The base has an acid dissociation constant between 7.2 and 45.

Another aspect of this description relates to a method for forming a semiconductor structure. The method includes depositing a material layer over a substrate, forming a layer of a reducing resist consumption (RRC) composition on the material layer, forming a photoresist layer comprising a metal-containing material on the RRC composition layer, patterning the photoresist layer to form a patterned photoresist layer, and etching the material layer using the patterned photoresist layer as an etch mask. The RRC composition includes a solvent and an acid or a base. The solvent has the following Hansen solubility parameters: a dispersion parameter between 10 and 25, a polarity parameter between 3 and 25, and a hydrogen bonding parameter between 4 and 30. The acid has an acid dissociation constant between −20 and 6.8. The base has an acid dissociation constant between 7.2 and 45.

Still another aspect of this description relates to a method for forming a semiconductor structure. The method includes depositing a material layer over a substrate, forming a layer of a reducing resist consumption (RRC) composition on the material layer. forming a photoresist layer comprising a metal-containing material on the RRC composition layer, exposing the photoresist layer to an extreme ultraviolet (EUV) radiation to form a patterned photoresist layer, and etching the material layer using the patterned photoresist layer as an etch mask. The RRC composition includes a first solvent having a hydrogen bonding parameter between 4 and 30, an acid having an acid dissociation constant between −20 and 6.8 or a base having an acid dissociation constant between 7.2 and 45, a chelating agent, a surfactant, a second solvent having a boiling point greater than 150° C., and an aqueous solvent or water.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for reducing resist consumption (RRC), comprising:

treating a surface of a substrate using a RRC composition; and forming a photoresist layer comprising a metal-containing material on the RRC composition treated surface, wherein the RRC composition comprises:

a first solvent having a dispersion parameter between 10 and 25; and an acid having an acid dissociation constant between −20 and 6.8, or a base having an acid dissociation constant between 7.2 and 45; and wherein the RRC composition further comprises a chelating agent.

2. The method of claim 1, wherein the first solvent comprises propylene glycol methyl ether (PGME), propylene glycol ethyl ether (PGEE), γ-butyrolactone, cyclohexanone, ethyl lactate, methyl isobutyl carbinol, propylene glycol monomethyl ether acetate, methanol, ethanol, propanol, n-butanol, acetone, dimethylfuran, acetonitrile, isopropyl alcohol, tetrahydrofuran, acetic acid, diacetone alcohol or combinations thereof.

3. The method of claim 1, wherein the first solvent has a polarity parameter between 3 and 25 and a hydrogen bonding parameter between 4 and 30.

4. The method of claim 3, wherein a concentration of the acid or base ranges from 0.1 wt. % to 20 wt. % based on a total weight of the RRC composition.

5. The method of claim 1, wherein the acid is an organic acid comprising ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, acetic acid, maleic acid or combinations thereof, or an inorganic acid including, but not limited to, nitric acid ($HNO_3$), sulfuric acid ($H_2SO_4$), hydrochloric acid (HCl), hydrobromic acid (HBr), phosphoric acid ($H_3PO_4$) or combinations thereof.

6. The method of claim 1, wherein the base is an organic base comprising monoethanolamine, monoisopropanolamine, 2-amino-2-methyl-1-propanol, 1H-benzotriazole, 1,2,4-triazole, 1,8-diazabicycloundec-7-ene, 1,5-diazabicyclo[4.3.0]non-5-ene or combinations thereof, or an inorganic base comprising ammonia ($NH_3$), ammonium hydroxide, ammonium sulfamate, ammonium carbamate, sodium hydroxide (NaOH), potassium hydroxide (KOH) or combinations thereof.

7. The method of claim 1, wherein the chelating agent comprises ethylenediaminetetraacetic acid (EDTA), ethylenediamine-N,N'-disuccinic acid (EDDS), diethylenetriaminepentaacetic acid (DTPA), polyaspartic acid, trans-1,2-cyclohexanediamine-N,N,N',N'-tetraacetic acid monohydrate, ethylenediamine or combinations thereof.

8. The method of claim 1, wherein the RRC composition further comprises a surfactant.

9. The method of claim 1, wherein the RRC composition further comprises a second solvent having a boiling point greater than 150° C.

10. The method of claim 1, wherein the RRC composition further comprises an aqueous solvent.

11. The method of claim 1, wherein the RRC composition further comprises water.

12. A method for forming a semiconductor structure, comprising:

depositing a material layer over a substrate;

forming a layer of a reducing resist consumption (RRC) composition on the material layer;

forming a photoresist layer comprising a metal-containing material on the RRC composition layer;

patterning the photoresist layer to form a patterned photoresist layer; and etching the material layer using the patterned photoresist layer as an etch mask, wherein the RRC composition comprises:

a solvent having the following Hansen solubility parameters:

a dispersion parameter between 10 and 25, a polarity parameter between 3 and 25, and a hydrogen bonding parameter between 4 and 30; and an acid having an acid dissociation constant between −20 and 6.8, or a base having an acid dissociation constant between 7.2 and 45; and wherein the RRC composition further comprises a chelating agent.

13. The method of claim 12, wherein the solvent comprises propylene glycol methyl ether (PGME), propylene glycol ethyl ether (PGEE), γ-butyrolactone, cyclohexanone, ethyl lactate, methyl isobutyl carbinol, propylene glycol monomethyl ether acetate, methanol, ethanol, propanol, n-butanol, acetone, dimethylfuran, acetonitrile, isopropyl alcohol, tetrahydrofuran, acetic acid, diacetone alcohol or combinations thereof.

14. The method of claim 12, wherein the acid is an organic acid comprising ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, acetic acid, maleic acid or combinations thereof, or an aqueous acid comprising $H_2SO_4$, $HNO_3$, HCl, $H_3PO_4$, $CCl_3COOH$, HBr or combinations thereof.

15. The method of claim 12, wherein the base is an organic base comprising monoethanolamine, monoisopropanolamine, 2-amino-2-methyl-1-propanol, 1H-benzotriazole, 1,2,4-triazole, 1,8-diazabicycloundec-7-ene, 1,5-diazabicyclo[4.3.0]non-5-ene or combinations thereof, or an aqueous base comprising NaOH, $NH_3$, KOH, TMAH, TEAH or combinations thereof.

16. The method of claim 12, wherein patterning the photoresist layer comprises:

exposing the photoresist layer to an extreme ultraviolet (EUV) radiation; and developing the exposed photoresist layer.

17. A method for forming a semiconductor structure, comprising:

depositing a material layer over a substrate;

forming a layer of a reducing resist consumption (RRC) composition on the material layer;

forming a photoresist layer comprising a metal-containing material on the RRC composition layer;

exposing the photoresist layer to an extreme ultraviolet (EUV) radiation to form a patterned photoresist layer; and etching the material layer using the patterned photoresist layer as an etch mask, wherein the RRC composition comprises:

a first solvent having a hydrogen bonding parameter between 4 and 30;

an acid having an acid dissociation constant between −20 and 6.8 or a base having an acid dissociation constant between 7.2 and 45;

a chelating agent;

a surfactant;

a second solvent having a boiling point greater than 150° C.; and an aqueous solvent; or water.

18. The method of claim 17, wherein the first solvent comprises propylene glycol methyl ether (PGME), propylene glycol ethyl ether (PGEE), γ-butyrolactone, cyclohexanone, ethyl lactate, methyl isobutyl carbinol, propylene glycol monomethyl ether acetate, methanol, ethanol, propanol, n-butanol, acetone, dimethylfuran, acetonitrile, isopropyl alcohol, tetrahydrofuran, acetic acid, diacetone alcohol or combinations thereof.

19. The method of claim 17, wherein the second solvent comprises cyclohexyl acetate (CHAX), dipropylene glycol dimethyl ether (DPDME), propylene glycol diacetate (PGDA), dipropylene glycol methyl n-propyl ether (DPMNP), dipropylene glycol methyl ether acetate (DPMA), 1,4-butanediol diacrylate (1,4-BDDA), 1,3-butanediol diacetate (1,3-BGDA), 1,6-hexanediol diacrylate (1,6-HDDA), tripropylene glycol monomethyl ether (TPM), 1,3-propanediol, propylene glycol, 1-methoxy-2-(2-propoxypropoxy)propane, hexane-1,6-diyl diacetate, butane-1,4-diyl diacetate, propane-1,2-diyl diacetate, 2-methoxy-1-((1-methoxypropan-2-yl)oxy)propane, 1-((1-methoxypropan-2-yl)oxy)propan-2-yl acetate, butane-1,2,4-triol, 2-(2-(2-methoxypropoxy)propoxy)propan-1-ol, and combinations thereof.

20. The method of claim 1, wherein a concentration of the chelating agent ranges from 0.001 wt. % to 30 wt. % based on a total weight of the RRC composition.

* * * * *